(12) United States Patent
Chen et al.

(10) Patent No.: US 8,098,076 B2
(45) Date of Patent: Jan. 17, 2012

(54) METHOD AND APPARATUS FOR TERMINATING A TEST SIGNAL APPLIED TO MULTIPLE SEMICONDUCTOR LOADS UNDER TEST

(75) Inventors: Guang Chen, San Jose, CA (US);
Charles Miller, Fremont, CA (US);
David Pritzkau, Brentwood, CA (US)

(73) Assignee: FormFactor, Inc., Livermore, CA (US)

( * ) Notice: Subject to any disclaimer, the term of this patent is extended or adjusted under 35 U.S.C. 154(b) by 67 days.

(21) Appl. No.: 12/416,375

(22) Filed: Apr. 1, 2009

(65) Prior Publication Data
US 2010/0253374 A1 Oct. 7, 2010

(51) Int. Cl.
*G01R 31/20* (2006.01)
(52) U.S. Cl. ............... 324/754.07; 324/754.11
(58) Field of Classification Search .............. None
See application file for complete search history.

(56) References Cited

U.S. PATENT DOCUMENTS

| | | | |
|---|---|---|---|
| 5,172,051 A * | 12/1992 | Zamborelli | 324/72.5 |
| 6,784,674 B2 | 8/2004 | Miller | |
| 6,798,225 B2 | 9/2004 | Miller | |
| 6,859,053 B1 * | 2/2005 | Sato et al. | 324/754 |
| 6,917,210 B2 | 7/2005 | Miller | |
| 7,012,442 B2 * | 3/2006 | Miller | 324/754 |
| 7,245,139 B2 | 7/2007 | Miller | |
| 7,414,418 B2 | 8/2008 | Miller | |
| 7,609,080 B2 | 10/2009 | Miller et al. | |
| 2006/0152234 A1 * | 7/2006 | Miller | 324/754 |

* cited by examiner

*Primary Examiner* — Roberto Velez
(74) *Attorney, Agent, or Firm* — Kirton & McConkie (57) ABSTRACT

Apparatus for terminating a test signal applied to multiple semiconductor loads under test is described—for example apparatus for interfacing a test signal between a tester and a semiconductor device under test (DUT). In some examples, a probe card assembly may include at least one probe substrate each having test probes configured to contact test features of a DUT; a wiring substrate, coupled to the at least one probe substrate, having a connector configured for coupling with a source termination of a tester; a signal path formed on and/or in the wiring substrate and the at least one probe substrate, the signal path having a trace and trace stubs fanning out from the trace, an input of the trace being coupled to the connector and outputs of the trace stubs being coupled to the test probes; and a resistive termination coupled between the trace and at least one potential.

30 Claims, 5 Drawing Sheets

METHOD AND APPARATUS FOR TERMINATING A TEST SIGNAL APPLIED TO MULTIPLE SEMICONDUCTOR LOADS UNDER TEST

BACKGROUND OF THE INVENTION

1. Field of the Invention

Embodiments of the present invention relate to semiconductor testing.

2. Description of the Related Art

Testing is an important step in the production of semiconductor devices for use. Typically, partially or fully completed semiconductor devices may be tested by bringing terminals disposed on an upper surface of a device to be tested—also referred to as a device under test (or DUT)—into contact with resilient contact elements, for example, as contained in a probe card assembly, as part of a test system. A test system controller may be coupled to the probe card assembly to send and receive test signals to and from the DUTs over a set of test channels. A test system controller with increased test channels can be a significant cost factor for a test system. Test system controllers have evolved to increase the number of channels and hence the number of devices that can be tested in parallel (sometimes referred to as multi-site testing).

One technique to accommodate testing of components on a wafer with a limited number of test channels is to fan out a signal from a test system controller in the probe card assembly to multiple transmission lines. That is, a test signal normally provided to a single DUT can be fanned out to multiple DUTs in the probe card assembly. This technique can enable testing of an increased number of DUTs during a single touchdown for a fixed number of test system channels. This technique can be referred to as test resource extension (TRE).

In some TRE designs, a tester can generate signals that propagate along a transmission line and reach multiple DUTs through multiple stubs (e.g., short transmission lines) that fan out from the transmission line. In some cases, the DUTs are capacitive, which can cause an increase in the rise and fall times of the test signal applied to the DUTs. This increase in rise/fall time can become more significant as the tester drives more DUTs in parallel. Some techniques to address the increase in rise/fall time for TRE designs are to limit the length of the stubs and/or optimize the topology of the DUT distribution. Such techniques, however, give rise to design constraints and are further limited as test signal frequency increases.

Accordingly, there exists a need in the art for a method and apparatus for testing semiconductor devices that attempts to overcome at least some of the aforementioned deficiencies.

SUMMARY OF THE INVENTION

Embodiments of the invention can relate to apparatus for interfacing a test signal between a tester and a semiconductor device under test (DUT). In some embodiments, an apparatus may include a probe card assembly having a connector configured for coupling with a source termination of the tester, and test probes configured to contact test features of the DUT; a signal path on and/or in the probe card assembly configured to have a trace and trace stubs fanning out from the trace, an input of the trace being coupled to the connector and outputs of the trace stubs being coupled to the test probes; and a resistive termination coupled between the trace and at least one potential.

Embodiments of the invention relate to a probe card assembly. In some embodiments, a probe card assembly may include at least one probe substrate each having test probes configured to contact test features of a DUT; a wiring substrate, coupled to the at least one probe substrate, having a connector configured for coupling with a source termination of a tester; a signal path formed on and/or in the wiring substrate and the at least one probe substrate, the signal path having a trace and trace stubs fanning out from the trace, an input of the trace being coupled to the connector and outputs of the trace stubs being coupled to the test probes; and a resistive termination coupled between the trace and at least one potential.

Embodiments of the invention relate to a method of decreasing rise/fall time of a test signal in a semiconductor test system. In some embodiments, the method includes generating the test signal at a tester; coupling the test signal to the DUT through a signal path on and/or in a probe card assembly, the signal path having a trace and trace stubs fanning out from the trace, an input of the trace being coupled to a source termination of the tester and outputs of the trace stubs being coupled to test probes configured to contact test features of the DUT; and terminating the trace using a resistive termination coupled between the trace and at least one potential.

BRIEF DESCRIPTION OF THE DRAWINGS

So that the manner in which features of the various embodiments of the present invention can be understood in detail, a more particular description of the invention, briefly summarized above and described more fully below, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Where possible, identical reference numerals are used herein to designate identical elements that are common to the figures. The images used in the drawings are simplified for illustrative purposes and are not necessarily depicted to scale.

DETAILED DESCRIPTION

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to"

another object regardless of whether the one object is directly on or attached to the other object or there are one or more intervening objects between the one object and the other object. Also, directions (e.g., above, below, top, bottom, side, up, down, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

The present invention provides an apparatus for terminating a test signal applied to multiple semiconductor loads under test. Aspects of the invention can relate to a signal path on a probe card assembly having a trace and multiple trace stubs fanning out from the trace. A source terminated tester can drive the trace with a test signal, which fans out over the trace stubs and is applied to the multiple semiconductor loads under test. A resistive termination can be coupled between the trace and at least one potential. In some embodiments, the resistive termination is coupled to a point on the trace between the source termination and a common node from which the trace stubs fan out. The resistive termination can provide a termination for absorbing test signal reflections and reduces the rise and fall times of the test signal applied to the semiconductor loads under test as compared to a trace without the resistive termination.

Figure 1:
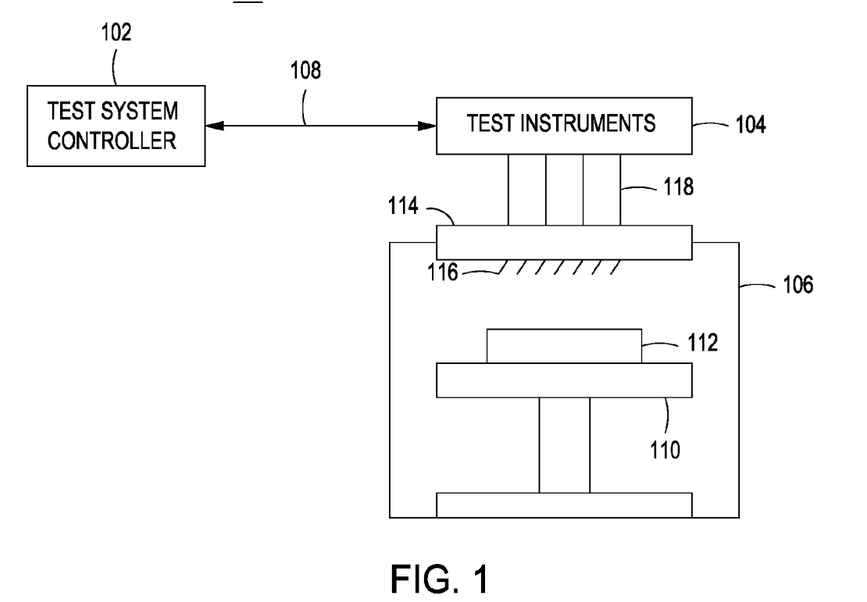
FIG. 1 depicts a test system according to some embodiments of the invention.

FIG. 1 depicts a test system 100 according to some embodiments of the invention. The test system 100 can generally include a test system controller 102, test instruments 104, a probe card assembly 114, and a prober 106. The test system controller 102 can be coupled to the test instruments 104 by a communication link 108. The test system controller 102 may comprise a host computer, for example. The prober 106 can include a stage 110 for mounting a device under test (DUT) 112 being tested. The DUT 112 can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, can refer to one or a plurality of such electronic devices. The probe card assembly 114 can include probes 116 (also referred to as test probes) that contact test features (e.g., input/output terminals) of the DUT 112. The stage 110 can be movable to contact the DUT 112 with probes 116.

In the test system 100, test data can be generated by the test instruments 104 and transmitted through the probe card assembly 114, the probes 116, and ultimately to the DUT 112. Overall control of the test instruments 104 for testing may be orchestrated by the test system controller 102 (e.g., a general purpose computer). Test results can then be provided from the DUT 112 back through the probe card assembly 114 to the test instruments 104. The test instruments 104 may transmit the test results to the test system controller 102 for analysis.

Test data and test results communicated between the test instruments 104 and the DUT 112 can be divided into individual test channels implemented on the probe card assembly 114. Exemplary test channels are described below. The test instruments 104 can be linked to the test channels by connectors 118 to the probe card assembly 114. The connectors 118 may be any suitable connectors, such as flexible cable connectors, pogo pins, zero insertion force (ZIF) connectors, or the like. The probe card assembly 114 can fan out one or more of the test channels to multiple probes 116. Such fan out can be referred to as test resource extension (TRE).

Figure 2:
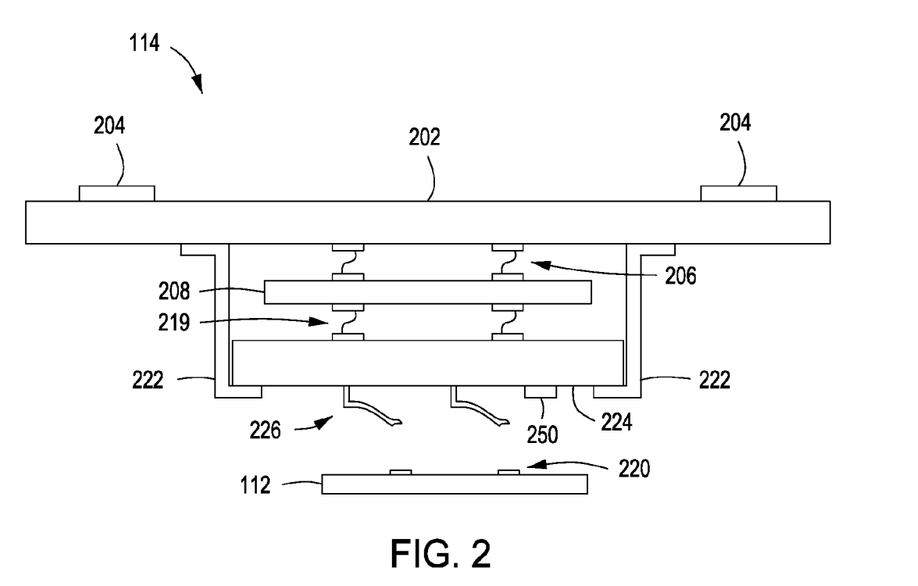
FIG. 2 depicts a probe card assembly according to some embodiments of the invention.

FIG. 2 depicts the probe card assembly 114 according to some embodiments of the invention. The probe card assembly 114 generally acts as an interface between the test instruments 104 and the DUT 112. The probe card assembly 114 can typically be a demountable assembly for use with various testers and probers. In some embodiments, the probe card assembly 114 can be specific to each type of DUT being tested. The probe card assembly 114 can include electrical connectors 204 configured to make electrical connections with the test instruments 104. The probe card assembly 114 can also include one or more resilient contact elements 226 as test probes. The resilient contact elements 226 can be configured to be pressed against, and thus make temporary electrical pressure connections with, one or more input and/or output terminals 220 of the DUT 112. The resilient contact elements 226 are typically configured to correspond to desired terminals 220 of the DUT 112 and may be arranged in one or more arrays having a desired geometry.

The probe card assembly 114 may include one or more substrates configured to support the connectors 204 and the resilient contact elements 226 and to provide electrical connections therebetween. The exemplary probe card assembly 114 shown in FIG. 2 has three such substrates, although in other implementations, the probe card assembly 114 can have more or fewer substrates. In the embodiment depicted in FIG. 2, the probe card assembly 114 includes a wiring substrate 202 (also referred to as a printed wiring board), an interposer substrate 208, and a probe substrate 224 (also referred to as a probe head). The wiring substrate 202, the interposer substrate 208, and the probe substrate 224 can generally be made of any type of suitable material or materials, such as, without limitation, printed circuit boards, ceramics, organic or inorganic materials, and the like, or combinations thereof. In some embodiments, it is sufficient that the probe substrate 224 be rigid to support the resilient contact elements 226.

Electrically conductive paths (examples shown below) are typically provided from the connectors 204 through the various substrates to the resilient contact elements 226. For example, in the embodiment depicted in FIG. 2, electrically conductive paths may be provided from the connectors 204 through the wiring substrate 202 to a plurality of electrically conductive spring interconnect structures 206. Other electrically conductive paths may be provided from the spring interconnect structures 206 through the interposer substrate 208 to a plurality of electrically conductive spring interconnect structures 219. Still other electrically conductive paths may further be provided from the spring interconnect structures 219 through the probe substrate 224 to the resilient contact elements 226. The electrically conductive paths through the wiring substrate 202, the interposer substrate 208, and the probe substrate 224 can comprise electrically conductive vias, traces, or the like, that may be disposed on, within, and/or through the wiring substrate 202, the interposer substrate 208, and the probe substrate 224.

The wiring substrate 202, the interposer substrate 208, and the probe substrate 224 may be held together by one or more brackets 222 and/or other suitable means (such as by bolts, screws, or other suitable fasteners). The configuration of the probe card assembly 114 shown in FIG. 2 is exemplary only and is simplified for ease of illustration and discussion and many variations, modifications, and additions are contemplated. For example, a probe card assembly may have fewer or more substrates (e.g., 202, 208, 224) than the probe card assembly 114 shown in FIG. 2. As another example, a probe card assembly may have more than one probe substrate (e.g., 224), and each such probe substrate may be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,662, issued Nov. 2, 1999 and U.S. Pat. No. 6,509,751, issued Jan. 21, 2003, as well as in the aforementioned U.S. patent application Ser. No. 11/165,833. It is contemplated that various features of the probe card assemblies described in those patents and application may be implemented in the probe card assembly 114 shown in FIG. 2 and that the probe card assemblies described in the aforementioned patents and application may benefit from the use of the inventive resistive termination and their configurations described herein.

In some embodiments, the probe substrate 224 can include one or more resistive elements 250. In some embodiments, one or more of the resistive elements 250 can include discrete resistor(s) mounted on the probe substrate 224. In some embodiments, one or more of the resistive elements 250 can include thin-film resistors or the like formed in or on the probe substrate 224. In some embodiments, one or more of the resistive elements 250 may be disposed in or on the interposer substrate 208, the wiring substrate 202, or both. Thus, the resistive elements 250 may be included on the probe substrate 224, the interposer substrate 208, the wiring substrate 202, or any combination thereof. As described below, the resistive elements 250 can be used as resistive terminations for impedance matching.

Figure 6:
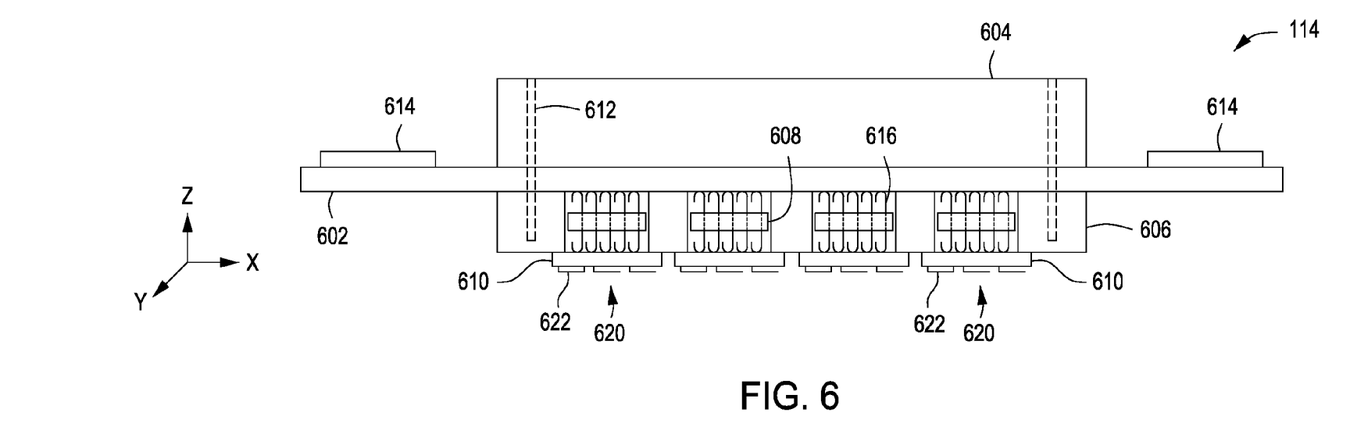
FIG. 6 depicts another probe card assembly according to some embodiments of the invention.

FIG. 6 depicts the probe card assembly 114 according to some other embodiments of the invention. The probe card assembly 114 can include a wiring substrate 602, a stiffener 604, a support substrate 606, interposer substrates 608, and one or more probe substrates 610. The stiffener 604 can be coupled to the support substrate 606 via pins 612 that extend through the wiring substrate 602. The wiring substrate 602 can be configured to float between the stiffener 604 and the support substrate 606. The wiring substrate 602 can support electrical connectors 614 configured to make electrical connections with the test instruments 104.

The support substrate 606 can include openings in which the interposer substrates 608 are respectively disposed. The interposer substrates 608 can electrically couple the wiring substrate 602 to the probe substrates 610. For example, each of the interposer substrates 608 may include electrically conductive spring interconnect structures 616 disposed therethrough that electrically couple the substrate 602 to respective probe substrates 610. Each of the probe substrates 610 can support one or more resilient contact elements 620 as test probes. The probe substrates 610 can be mounted to the support substrate 606. The stiffener 604 and/or the support substrate 606 can provide stiffness in a "z" direction. The pins 612 can provide stiffness in a "z" direction, while being compliant in an "x" and/or "y" direction.

Electrically conductive paths (examples shown below) are typically provided from the connectors 614 through the various substrates to the resilient contact elements 620. For example, in the embodiment depicted in FIG. 6, electrically conductive paths may be provided from the connectors 614 through the wiring substrate 602 to the electrically conductive spring interconnect structures 616. Other electrically conductive paths may be provided from the spring interconnect structures 616 through the probe substrates 610 to the resilient contact elements 620. The electrically conductive paths through the wiring substrate 602, the interposer substrates 608, and the probe substrates 610 can comprise electrically conductive vias, traces, or the like, that may be disposed on, within, and/or through the wiring substrate 602 and the probe substrates 610. The wiring substrate 602, the interposer substrates 608, and the probe substrates 610 can generally be made of any type of suitable material or materials, such as, without limitation, printed circuit boards, ceramics, organic or inorganic materials, and the like, or combinations thereof.

In some embodiments, each of the probe substrates 610 can include one or more resistive elements 622. In some embodiments, one or more of the resistive elements 622 can include discrete resistor(s) mounted on the probe substrates 610. In some embodiments, one or more of the resistive elements 622 can include thin-film resistors or the like formed in and/or on the probe substrates 610. In some embodiments, one or more of the resistive elements 622 may be disposed in or on the interposer substrates 608, the wiring substrate 602, or both. Thus, the resistive elements 622 may be included on the probe substrates 610, the interposer substrates 608, the wiring substrate 602, or any combination thereof. As described below, the resistive elements 622 can be used as resistive terminations for impedance matching.

Figure 7:
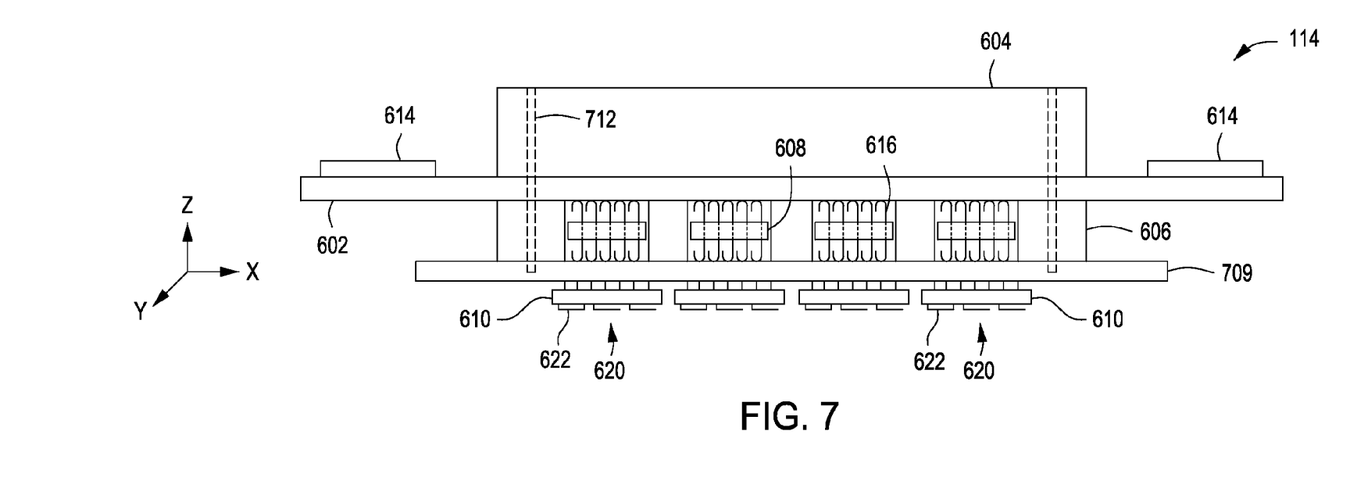
FIG. 7 depicts another probe card assembly according to some embodiments of the invention.

FIG. 7 depicts the probe card assembly 114 according to some other embodiments of the invention, which is similar to FIG. 6, except that the probe substrates 610 can be mounted to a mounting substrate 709. The mounting substrate 709 can be coupled to the stiffener 604 via pins 712. Each of the interposer substrates 608 may include electrically conductive spring interconnect structures 618 coupled to the mounting substrate 709. The probe substrates 610 can be electrically and mechanically coupled to the mounting substrate 709 using, for example, solder or like type connections. The substrate 709 can be configured with a coefficient of thermal expansion (CTE) that matches or nearly matches that of the DUT 112.

Similar to the embodiment described above with respect to FIG. 6, electrically conductive paths may be provided from the connectors 614 through the wiring substrate 602 to the electrically conductive spring interconnect structures 616. Other electrically conductive paths may be provided from the spring interconnect structures 616 through the mounting substrate 709 to the probe substrates 610. The electrically conductive paths through the mounting substrate 709 can comprise electrically conductive vias, traces, or the like, that may be disposed on, within, and/or through the mounting substrate 709. The mounting substrate 709 can generally be made of any type of suitable material or materials, such as, without limitation, printed circuit boards, ceramics, organic or inorganic materials, and the like, or combinations thereof.

Figure 3:
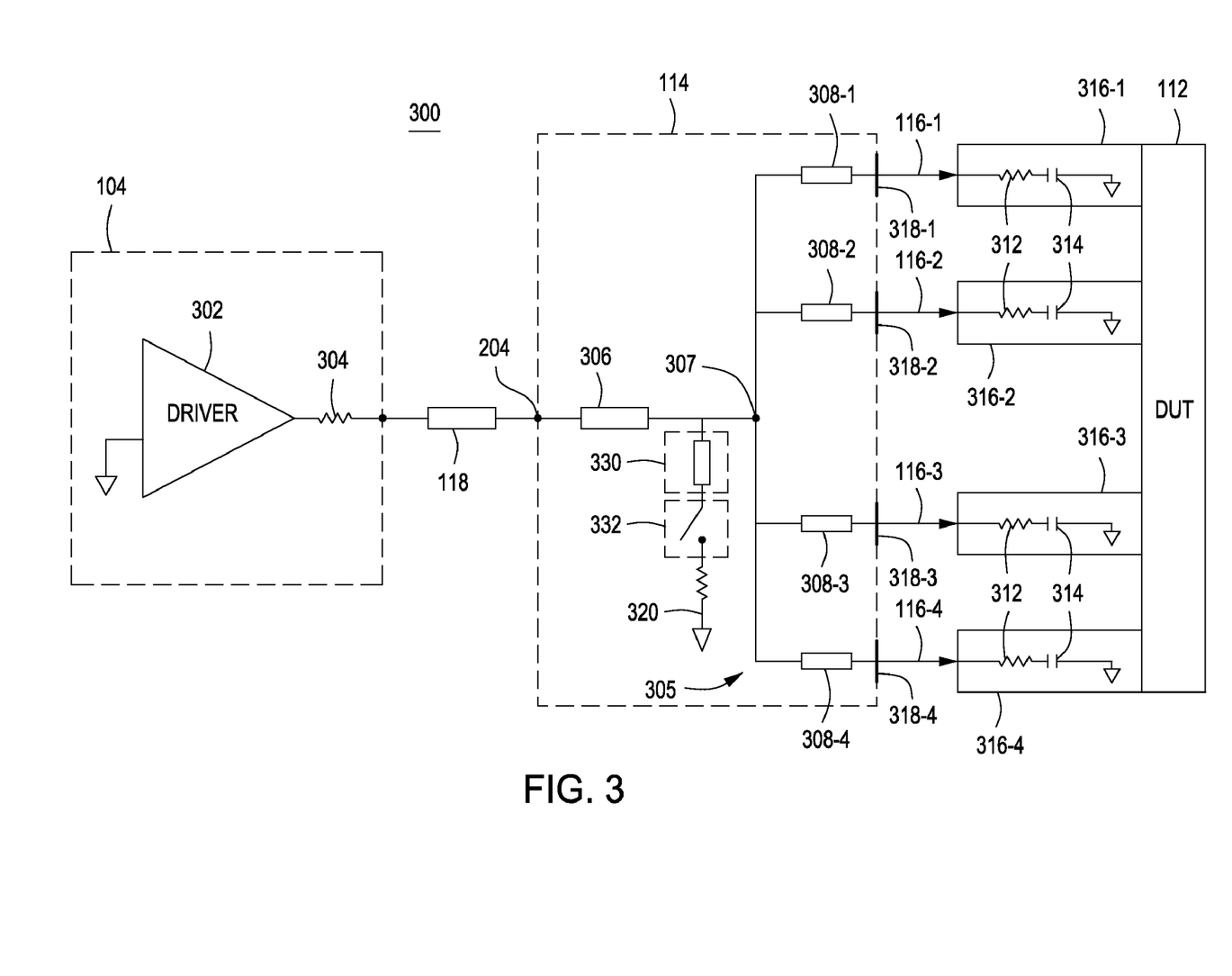
FIG. 3 is a block diagram depicting a test channel according to some embodiments of the invention.

FIG. 3 is a block diagram depicting a test channel 300 according to some embodiments of the invention. With reference to FIGS. 1-3, test channel 300 can include a driver 302 that is configured to provide a test signal to multiple semiconductor loads on the DUT 112 (the driver may be generally referred to as a tester). For clarity by example, embodiments of the invention are described with respect to testing a single DUT 112. In some embodiments, embodiments of the invention may be used to test multiple DUTs configured similarly to the DUT 112. The driver 302 can be coupled to a connector 204 through a resistor 304 and a connector 118. The driver 302 and the resistor 304 can comprise a portion of the test instruments 104. The connector 204 can be coupled to an input of a signal path 305 on the probe card assembly 114 that provides for TRE.

The signal path 305 can include a trace 306 coupled to trace stubs 308-1 through 308-4 (collectively trace stubs 308). The trace 306 and the trace stubs 308 can be transmission lines implemented on the probe card assembly 114. An input of the trace 306 can be coupled to the connector 204, and an output of the trace 306 can be coupled to a common node 307. Inputs of the trace stubs 308 can be coupled to the common node 307 such that the trace stubs 308 fan out from the trace 306 at the common node 307. Outputs of the trace stubs 308 can be coupled to pads 318-1 through 318-4 (collectively pads 318) on the probe card assembly 114. The common node 307 is meant to be a logical connection between the trace 306 and the trace stubs 308, and is not meant to imply any particular physical coupling structure between the trace and the trace stubs 308.

Probes 116-1 through 116-4 (of the probes 116) can be formed on the pads 318-1 through 318-4. The probes 116-1 through 116-4 can respectively couple the trace stubs 308-1 through 308-4 to input terminals 316-1 through 316-4 (collectively input terminals 316) on the DUT 112. In this manner, a test signal produced by the driver 302 can be coupled to the DUT 112 through the connector 118, the signal path 305, the probes 116, and the input terminals 316. The trace stubs 308 may each be of the same length and thus each have the same electrical delay. Alternatively, the trace stubs 308 may be of differing lengths and thus have different electrical delays. By way of example, the trace 306 is shown fanning out into four trace stubs 308 for testing four input terminals 316 of the DUT 112. The trace 306 can fan out into fewer or more than four trace stubs 308.

The trace 306 can include a characteristic impedance. In a non-limiting embodiment, the trace 306 can be fabricated to have a characteristic impedance of approximately 50 ohms. The connector 118 can include a characteristic impedance that matches the characteristic impedance of the trace 306 in order to mitigate reflections of the test signal. Matching characteristic impedances have the same or similar impedance values. The resistor 304 can include an impedance value that matches the characteristic impedance of the connector 118 and the trace 306. In this manner, the resistor 304 can provide a source termination of the driver 302, which can absorb reflections of the test signal.

In some embodiments, a resistive termination 320 can be coupled between the trace 306 and at least one potential. In the embodiments shown in FIG. 3, the resistive termination 320 includes a resistor coupled to electrical ground. In some embodiments, the resistive termination 320 can include a resistor coupled to a voltage bias, rather than electrical ground. For example, in some embodiments, the resistive termination 320 can be coupled to a voltage bias in cases where the signal is referenced to the voltage bias, rather than electrical ground. In some embodiments, the resistive termination 320 may include a plurality of resistors. For example, the resistive termination 320 may include two or more serial resistors coupled between the trace 306 and a potential (e.g., electrical ground or a voltage bias). In another example, the resistive termination 320 may include two or more parallel resistors coupled between the trace 306 and a potential (e.g., electrical ground or a voltage bias). In another example, the resistive termination 320 may include two or more parallel resistors coupled to multiple potentials (e.g., one resistor coupled to electrical ground and another parallel resistor coupled to a voltage bias).

An input impedance of each of the input terminals 316 may be represented by an equivalent circuit of a resistor 312 in series with a capacitor 314 coupled to electrical ground. For example, if the DUT 112 is a complementary-metal-oxide-semiconductor (CMOS) device, an input terminal is known to be primarily capacitive. Thus, the resistive termination 320 is in parallel with the series pair of the resistor 312 and the capacitor 314 of each of the input terminals 316. Reflections of the test signal can be reduced or minimized at the common node by making the parallel combination of the resistive termination 320 and the input impedances of the input terminals 316 approximately equal to the characteristic impedance of the trace 306. In some embodiments, the input impedances of the input terminals 316 of the DUT 112 are sufficiently greater than the characteristic impedance of the trace 306. In general, placing the resistive termination 320 before the trace stubs 308 can minimize reflections because: 1) the parallel termination of resistive termination 320 can be smaller compared to the parallel combinations of the resistor 312 and the capacitor 314 for the input terminals 316 for a relevant range of frequency operation so the signal is affected by mostly the resistive termination 320; and 2) the electrical delay of the trace stubs 308 can be smaller than the signal rise-time so that the trace stubs 308 are short enough to ignore the distributive behavior of transmission lines (i.e. the trace stubs 308 simply present the load of the input terminals 316 to the common node 307). Once one or both of these criteria are not met, the effectiveness of the resistive termination 320 is reduced and the signal input to the input terminals 316 can be attenuated.

As such, the resistive termination 320 can be formed with an impedance that matches the characteristic impedance of the trace 306. The lengths of the trace stubs 308 can be configured to provide electrical delays less than the rise-times of the signals being propagated. In such a case, the parallel combination of the resistive termination 320 and the input impedances of the input terminals 316 have an impedance approximately equal to the characteristic impedance of the trace 306. Accordingly, the resistive termination 320 can provide a termination for the load (DUT 112), which can prevent the test signal from reflecting back to the source. In cases where the input impedances of the input terminals 316 are on the order of the characteristic impedance of the trace 306, the resistive termination 320 can be formed with an appropriate impedance for causing the parallel combination of the resistive termination 320 and the input impedances to approximately match the characteristic impedance of the trace 306. If the lengths of the trace stubs 308 provide electrical delays greater than the rise-times of the signals being propagated, the resistive termination 320 can be effective at the ends of the trace stubs 308.

In general, the resistive termination 320 can generally be placed at any point along the trace 306 between the connector 204 and the common node 307. Thus, from the perspective of a test signal being provided from the driver 302, the resistive termination 320 is placed after the source termination 304 but before the fan out of the trace stubs 308. As noted above, the common node 307 is meant to be a logical connection, and thus above-described placement of the resistive termination 320 is a logical placement not meant to imply any particular physical placement. Physical placement of the resistive termination 320 is only constrained by the ability of the resistive termination to function as described herein. In some embodiments, the resistive termination 320 is placed at or near the end of the trace 306 that is proximate the probes 116. In the present example, the resistive termination 320 can be placed at or near the common node 307. In some embodiments, the resistive termination 320 is placed closer to the common node 307 than to the connector 204. In some embodiments, the trace 306 is formed on the wiring substrate (202, 602, 702) and the trace stubs 308 are formed on the probe substrate(s) (224, 610, 710). In some embodiments, the resistive termination 320 can be placed on the wiring substrate (202, 602, 702) at or near the end of the trace 306 that is proximate the probe substrate(s) (224, 610, 710). In some embodiments, the resistive termination 320 can be placed on the probe substrate(s)

(224, 610, 710). In some embodiments, the resistive termination 320 can be formed on intervening substrates, such as the interposer substrate(s) (208, 608, 708). For any of the substrates, the resistive termination 320 can be formed on either side of the substrate or within the substrate. The resistive termination 320 can be implemented as one or more thin film resistors built into or on any of the substrates or as one or more discrete circuit elements attached to any of the substrates.

Since the input terminals 316 of the DUT 112 can be capacitive, a change from a logic low to a logic high signal is not detected by the DUT 112 until a sufficient charge builds up on the capacitor 314 in each of the input terminals 316. Similarly, a change from a logic high to a logic low signal is not detected by the DUT 112 until the built up charge dissipates. Accordingly, the capacitance at the input terminals 316 can affect the rise and fall times of the test signal applied to the DUT 112. In some embodiments, the lengths of the trace stubs 308 can provide electrical delays less than the rise-times of the signals being propagated. The resistive termination 320, which is in parallel with the impedances of the input terminals 316, can reduce the time constant of the R-C impedance of the input terminals 316, which in turn reduces the degradation of the rise/fall time of the test signal that would be caused by the input terminals 316 without the resistive termination. If the lengths of the trace stubs 308 provide electrical delays more than the rise-times of the signals being propagated, the rise/fall time of the test signal can be further degraded due to signal attenuation loss, such loss being distinct from loss due to the R-C time constant effect described above.

In some embodiments, the trace stubs 308 are formed such that each has a characteristic impedance of approximately the same value as the trace 306. For example, each of the trace stubs 308 may have a characteristic impedance of 50 ohms. The trace stubs 308 may be formed on the probe substrate 214 and thus may be space-limited. Thus, the formation of trace stubs 308 with larger characteristic impedances (e.g., larger than 50 ohms) may be impracticable and/or undesirable. For example, in cases where it is not possible to manufacture a narrower trace, the only way to increase the impedance of a trace is to increase the dielectric height between the trace and its reference plane (i.e. ground plane). Increasing the dielectric height, however, results in increasing crosstalk. Thus, there is a trade-off between minimizing reflection and minimizing crosstalk.

Assume for the purposes of exposition that the trace 306 and the trace stubs 308 each have a characteristic impedance of 50 ohms. Without the resistive termination 320, there would be a mismatch of impedance at the common node 307. That is, the trace stubs 308 as a parallel group would see a characteristic impedance of 50 ohms, whereas the trace 306 would see a characteristic impedance of 12.5 ohms (four 50 ohm impedances in parallel). Without the resistive termination 320, reflections of the test signal would occur at the common node 307, which would deleteriously affect test signal integrity. To achieve a match, each of the trace stubs 308 would need to have a 200 ohm characteristic impedance. But, as described above, the trace stubs 308 may be space-limited or otherwise incapable of being formed to provide such a characteristic impedance. The resistive termination 320 can shunt across the trace stubs 308 (i.e., combine with the trace stubs in parallel), creating an effective impedance approximately equal to the characteristic impedance of the trace 306. As such, the resistive termination 320 can allow both the trace 306 and the trace stubs 308 to be designed with a 50 ohm characteristic impedance. In general, the resistive termination 320 can allow the trace stubs 308 to be designed with any characteristic impedance independent of the characteristic impedance of the trace 306. However, it is desirable for the characteristic impedance of the trace stubs 308 to match or be close to matching the characteristic impedance of the trace 306 in order to reduce reflections of the test signal at the interface therebetween.

Further, the resistive termination 320 can exhibit a reduced number of termination components as compared to having one or more termination resistors for each of the trace stubs 308. Thus, the single resistive termination 320 can provide a space savings, which can be advantageous, particularly in probe card assemblies where space is limited. In addition, if a termination resistor is used at the end of each of the trace stubs 308 proximate the DUT 112, the parallel combination of such termination resistors have to match the impedance of the trace 306. Thus, if the trace 306 has a characteristic impedance of 50 ohms, then the resistors at the end of the trace stubs 308 would need to be 200 ohms each so that their parallel combination matches the impedance of the trace 306. However, if each of the trace stubs 308 is 50 ohms, then for each of the trace stubs 308, a 200 ohm resistor would be used to terminate a 50 ohm impedance of the stub, which is not ideal and can deleteriously affect the propagating signals. The inventors have found that better performance may be achieved by placing a matching resistive termination 320 on the trace 306 before the fanout of the trace stubs 308, as described in the embodiments above.

Moreover, the resistive termination 320 can allow for an increased number of trace stubs in the fan out as compared to TRE designs without the resistive termination 320. As discussed above, the resistive termination 320 can reduce the rise/fall time of the test signal applied to the DUT 112. In cases where the resistive termination 320 reduces the rise/fall time of the test signal beyond that which is required based on the frequency and specifications of the DUT 112, more trace stubs can be provided if necessary (the effect of which would increase the rise/fall time of the test signal). That is, the resistive termination 320 can compensate for the increase in rise/fall time of the test signal as a result of adding more trace stubs to the fan out.

As is apparent from FIG. 3, the resistor 304 of the source termination and the resistive termination 320 of the load termination provide a voltage divider. Thus, the output voltage of the driver 302 can be implemented to account for the voltage divider so that the DUT 112 can receive its specified input voltage.

In some embodiments, the resistive termination 320 can be coupled to the trace 306 (e.g., at or before the common node 307) through an optional transmission line 330. The transmission line 330 can have the same impedance as the trace 306. To the extent that the transmission line 330 does match the impedance of the trace 306, the transmission line 330 will not change the effectiveness of the resistive termination 320 as set forth above. Generally, there are no restrictions on the length of the transmission line 330.

In some embodiments, the resistive termination 320 can be coupled to the trace 306 (e.g., at or before the common node 307) through an optional switch 332. When the switch 332 is closed, the resistive termination 320 functions as described above. When the switch 332 is open, the resistive termination 320 can be effectively removed from the test channel 300. Removing the resistive termination 320 can be advantageous, for example, when measuring leakage current in the test channel 300. Leakage current measurements involve attempts to measure small currents relative to the test signal. The resistive termination 320 can add a path for the current such that the leakage can no longer be measured. Leakage current can be measured by opening the switch 332. The combination of the resistive termination 320 and the resistance of the switch 332 in the "on" position can be set to match the impedance of the trace 306.

In some embodiments, the resistive termination 320 can be coupled to the trace 306 (e.g., at or before the common node 307) through both the optional transmission line 330 and the optional switch 332. In some embodiments, the switch 332 can be coupled to the trace 306, and the resistive termination 320 can be coupled to the switch 332 through the transmission line 330. In some embodiments, the transmission line 330 can be coupled to the trace 306, and the resistive termination 320 can be coupled to the transmission line 330 through the switch 332. If the combination of the transmission line 330 and the switch 332 are employed, the impedance of the transmission line 330 can match the impedance of the trace 306.

Figure 4:
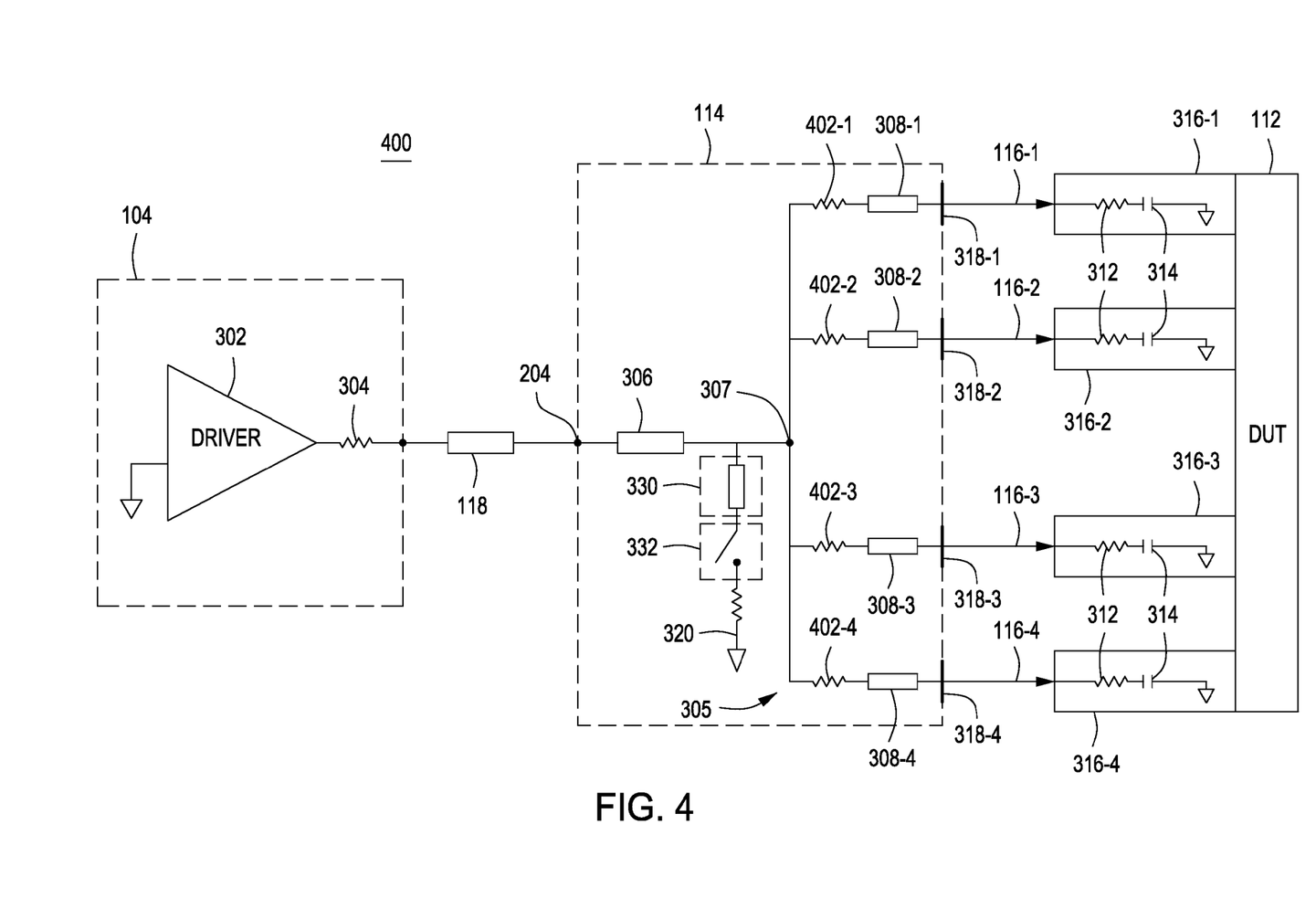
FIG. 4 is a block diagram depicting a test channel according to some embodiments of the invention.

FIG. 4 is a block diagram depicting a test channel 400 according to some embodiments of the invention. Elements in FIG. 4 that are the same or similar to those in FIG. 3 are designated with identical reference numerals and are described in detail above. For clarity by example, embodiments of the invention are described with respect to testing a single DUT 112. In some embodiments, embodiments of the invention may be used to test multiple DUTs configured similarly to the DUT 112. In the present example, each of the trace stubs 308-1 through 308-4 can include an isolation resistor 402-1 through 402-4 (collectively isolation resistors 402). The isolation resistors 402 can mitigate the adverse effect of a fault at one of the input terminals 316 on others of the input terminals 316. For example, absent isolation resistors 402, a fault in which the input terminal 316-1 is shorted to ground would also short input terminals 316-2 through 316-4 to ground via trace stubs 308-1 through 308-4. This would cause the input terminals 316-2 through 316-4 to falsely test as having the same fault as the input terminal 316-1. The isolation resistors 402 can isolate the fault at the input terminal 316-1 from the other input terminals 316-2 through 316-4.

The additional resistance provided by the isolation resistors 402, however, can adversely affect the rise and fall times of the test signal at the input terminals 316. That is, the additional resistance of the isolation resistors 402-1 through 402-4 adds with that of the resistors 312 in the input terminals 316-1 through 316-4, thus increasing the time constant of the R-C circuit. The resistive termination 320, however, is shunted across (i.e., in parallel with) the trace stubs 308 and isolation resistors 402. The resistive termination 320, which is in parallel with the impedances of the serial combination of the isolation resistors 402 and the input terminals 316, can reduce the R-C time constant, which in turn reduces rise/fall time of the test signal as applied to the input terminals 316. Thus, the resistive termination 320 can mitigate the affect of the addition of the isolation resistors 402.

Figure 5:
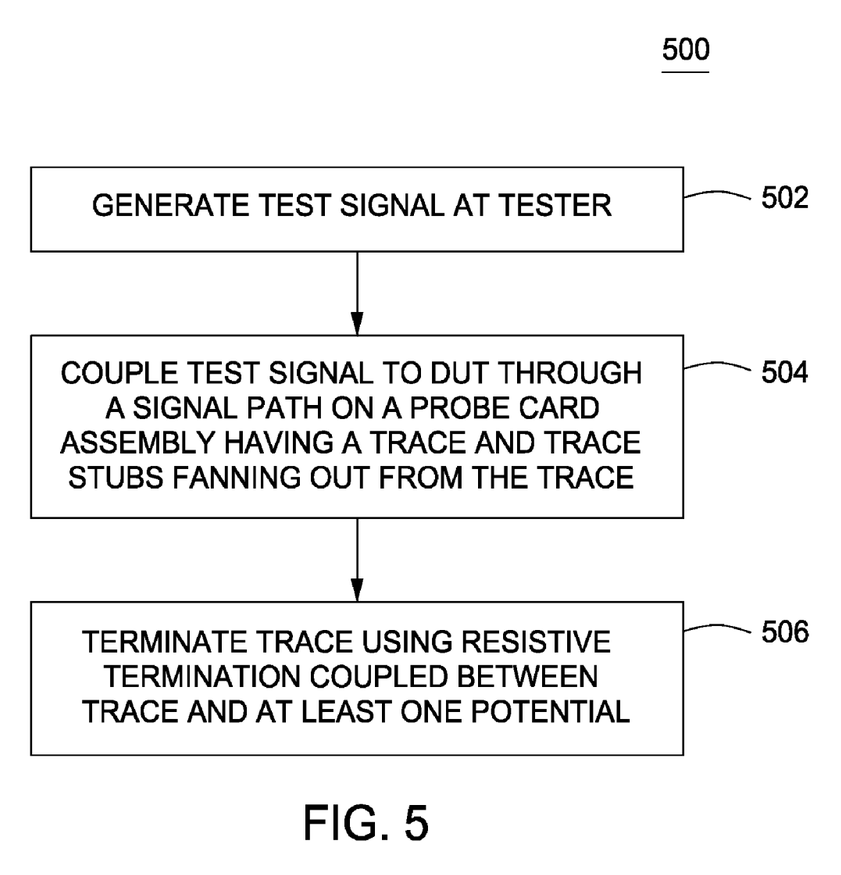
FIG. 5 is a flow diagram depicting a method of decreasing rise/fall time of a test signal in a semiconductor test system according to some embodiments of the invention.

FIG. 5 is a flow diagram depicting a method 500 of decreasing rise/fall time of a test signal in a semiconductor test system according to some embodiments of the invention. A tester can generate a test signal (502). The test signal may be coupled to a DUT through a signal path on a probe card assembly having a trace and trace stubs fanning out from the trace (504). For example, the signal path may be configured as described in the embodiments above, where an input of the trace can be coupled to a source termination of the tester and outputs of the trace stubs can be coupled to test probes configured to contact test features of the DUT. The trace can be terminated using a resistive termination coupled between the trace and at least one potential. (506). For example, the resistive termination can be configured as described in the embodiments above.

While the foregoing is directed to embodiments of the present invention, other and further embodiments of the invention may be devised without departing from the basic scope thereof, and the scope thereof is determined by the claims that follow.

The invention claimed is:

1. A probe card assembly, comprising:
   at least one probe substrate each having test probes configured to contact test features of a device under test (DUT);
   a wiring substrate, coupled to the at least one probe substrate, having a connector configured for coupling with a source termination of a tester;
   a signal path formed in and/or on the wiring substrate and the at least one probe substrate, the signal path having a trace and trace stubs fanning out from the trace, an input of the trace being coupled to the connector and outputs of the trace stubs being coupled to the test probes; and
   a resistive termination separate from the signal path and coupled from the trace to at least one potential,
   wherein an impedance of the resistive termination and impedances of the trace stubs are in parallel and a parallel sum of the impedance of the resistive termination and the impedances of the trace stubs is approximately equal to an impedance of the trace.

2. The probe card assembly of claim 1, wherein the resistive termination is coupled to a point on the trace between the input of the trace and a common node from which the trace stubs fan out.

3. The probe card assembly of claim 2, wherein the resistive termination is closer to the common node than to the connector.

4. The probe card assembly of claim 1, wherein each of the trace stubs includes serial resistive element distinct from the resistive termination between the common node from which the trace stubs fan out and a respective one of the test probes.

5. The probe card assembly of claim 1, wherein the trace stubs and the resistive termination are formed on or in the at least one probe substrate.

6. The probe card assembly of claim 1, wherein the resistive termination is formed on or in the wiring substrate.

7. The probe card assembly of claim 1, further comprising:
   at least one interposer substrate coupling the at least one probe substrate and the wiring substrate;
   wherein the resistive termination is formed on and/or in the at least one interposer substrate.

8. The probe card assembly of claim 1, wherein the resistive termination comprises at least one discrete resistor or at least one thin film resistor.

9. The probe card assembly of claim 1, wherein the at least one probe substrate includes a plurality of probe substrates, and wherein the resistive termination is formed on each of the plurality of probe substrates.

10. The probe card assembly of claim 1, wherein a parallel sum of the impedances of the trace stubs does not match the impedance of the trace.

11. The probe card assembly of claim 1, further comprising:
   a transmission line coupled between the trace and the resistive termination, wherein the transmission line is distinct from the trace and the trace stubs.

12. The probe card assembly of claim 11, further comprising:
   a switch coupled between the trace and the transmission line.

13. The probe card assembly of claim 11, further comprising:
   a switch coupled between the transmission line and the resistive termination.

14. The probe card assembly of claim 1, further comprising:
   a switch coupled between the trace and the resistive termination.

15. The probe card assembly of claim 1, wherein the resistive termination is distinct from any electrical path in the probe card assembly to the probes.

16. Apparatus for interfacing a test signal between a tester and a semiconductor device under test (DUT), comprising:
   a probe card assembly having a connector configured for coupling with a source termination of the tester, and test probes configured to contact test features of the DUT;
   a signal path in and/or on the probe card assembly, the signal path having a trace and trace stubs fanning out from the trace, an input of the trace being coupled to the connector and outputs of the trace stubs being coupled to the test probes;
   a resistive termination separate from the signal path and coupled from the trace to at least one potential,
   wherein an impedance of the resistive termination and impedances of the trace stubs are in parallel and a parallel sum of the impedance of the resistive termination and the impedances of the trace stubs is approximately equal to an impedance of the trace.

17. The apparatus of claim 16, wherein the resistive termination is coupled to a point on the trace between the input of the trace and a common node from which the trace stubs fan out.

18. The apparatus of claim 17, wherein the resistive termination is closer to the common node than to the connector.

19. The apparatus of claim 16, wherein each of the trace stubs includes a serial resistive element distinct from the resistive termination between the common node from which the trace stubs fan out and a respective one of the test probes.

20. The apparatus of claim 16, wherein a parallel sum of the impedances of the trace stubs does not match the impedance of the trace.

21. The apparatus of claim 16, further comprising:
   a transmission line coupled between the trace and the resistive termination, wherein the transmission line is distinct from the trace and the trace stubs.

22. The apparatus of claim 16, further comprising:
   a switch coupled between the trace and the resistive termination.

23. The apparatus of claim 16, further comprising:
   a switch and a transmission line coupled between the trace and the transmission line.

24. The apparatus of claim 16, wherein the resistive termination is distinct from any electrical path in the probe card assembly to the probes.

25. A method of decreasing rise/fall time of a test signal in a semiconductor test system, comprising:
   generating the test signal at a tester;
   coupling the test signal to a DUT through a signal path in and/or on a probe card assembly, the signal path having a trace and trace stubs fanning out from the trace, an input of the trace being coupled to a source termination of the tester and outputs of the trace stubs being coupled to test probes configured to contact test features of the DUT; and
   terminating the trace with a resistive termination separate from the signal path and coupled from the trace to at least one potential,
   wherein an impedance of the resistive termination and impedances of the trace stubs are in parallel and a parallel sum of the impedance of the resistive termination and the impedances of the trace stubs is approximately equal to an impedance of the trace.

26. The method of claim 25, wherein the resistive termination is coupled to a point on the trace between the input of the trace and a common node from which the trace stubs fan out.

27. The method of claim 26, wherein the resistive termination is closer to the common node than to the source termination of the tester.

28. The method of claim 25, wherein a serial resistive element distinct from the resistive termination is coupled between the common node from which the trace stubs fan out and a respective one of the test probes for each of the trace stubs.

29. The method of claim 25, wherein a parallel sum of the impedances of the trace stubs does not match the impedance of the trace.

30. The method of claim 25, wherein the resistive termination is distinct from any electrical path in the probe card assembly to the probes.

* * * * *